US009017823B2

(12) United States Patent
Liu et al.

(10) Patent No.: US 9,017,823 B2
(45) Date of Patent: Apr. 28, 2015

(54) MACHINE COMPONENT WITH A CAVITATION RESISTANT COATING

(75) Inventors: Tianjun Liu, Edwards, IL (US); Marvin Grendel McKimpson, Germantown Hills, IL (US)

(73) Assignee: Caterpillar Inc., Peoria, IL (US)

( * ) Notice: Subject to any disclaimer, the term of this patent is extended or adjusted under 35 U.S.C. 154(b) by 506 days.

(21) Appl. No.: 13/329,974

(22) Filed: Dec. 19, 2011

(65) Prior Publication Data

US 2013/0157081 A1  Jun. 20, 2013

(51) Int. Cl.
*B32B 15/04* (2006.01)
*B32B 15/18* (2006.01)
(Continued)

(52) U.S. Cl.
CPC . *C22C 38/36* (2013.01); *C23C 4/04* (2013.01); *C23C 2/04* (2013.01); *C23C 14/06* (2013.01); *C23C 24/103* (2013.01); *C23C 26/00* (2013.01); *C23C 30/005* (2013.01); *F02F 1/004* (2013.01); *Y10T 428/12958* (2015.01); *Y10T 428/12965* (2015.01); *Y10T 428/12972* (2015.01); *Y10T 428/12979* (2015.01); *Y10T 428/26* (2015.01); *B32B 15/011* (2013.01); *C22C 38/002* (2013.01); *C22C 38/02* (2013.01); *C22C 38/04* (2013.01); *C22C 38/12* (2013.01); *C22C 38/16* (2013.01); *C22C 38/20* (2013.01);
(Continued)

(58) Field of Classification Search
CPC ...... B32B 15/01; B32B 15/011; B32B 15/04; B32B 15/043; B32B 15/18; B32B 2255/06; B32B 2307/536; B32B 2307/30; B32B 311/30; C23C 4/04; C23C 2/04; C23C 14/06; C23C 14/16; C23C 24/103; C23C 24/106; C23C 26/00; C23C 26/02; C23C 30/00; C23C 30/005; C22C 38/20; C22C 38/16; C22C 38/34; C22C 38/24; C22C 38/32; C22C 38/002; C22C 38/36; C22C 38/12; C22C 38/04; C22C 33/0257; Y10T 428/12958; Y10T 428/12965; Y10T 428/12972; Y10T 428/12979; Y10T 428/26
USPC .......... 428/685, 684, 682, 681, 683, 332, 457
See application file for complete search history.

(56) References Cited

U.S. PATENT DOCUMENTS 2,117,191 A   1/1930   McCauley
2,462,056 A   2/1949   McCauley
(Continued)

FOREIGN PATENT DOCUMENTS

JP   2000-239770 A   9/2000

OTHER PUBLICATIONS

Persson, U., New Iron—Chromium based Brazing Filler Metal for Demanding Stainless Steel Applications, Presented at the 4th International Brazing & Soldering Conference (IBSC) in Orlando, Florida, Apr. 26-29, 2009, 5 pages.
(Continued)

*Primary Examiner* — Michael E La Villa
(74) *Attorney, Agent, or Firm* — Finnegan, Henderson, Farabow, Garrett & Dunner, LLP

(57) ABSTRACT

A machine component may include a body made of an iron alloy. The body may include a surface, and a coating fused to the surface. The coating may be an alloy including phosphorous, carbon, and iron. The coating may have solidus temperature of less than or equal to about 1000° C., and a hardness greater than or equal to about 50 HRC.

13 Claims, 2 Drawing Sheets

(51) Int. Cl.
| | |
|---|---|
| *C23C 30/00* | (2006.01) |
| *F02F 1/12* | (2006.01) |
| *C22C 38/36* | (2006.01) |
| *C23C 4/04* | (2006.01) |
| *C23C 2/04* | (2006.01) |
| *C23C 14/06* | (2006.01) |
| *C23C 24/10* | (2006.01) |
| *C23C 26/00* | (2006.01) |
| *F02F 1/00* | (2006.01) |
| *B32B 15/01* | (2006.01) |
| *C22C 38/00* | (2006.01) |
| *C22C 38/02* | (2006.01) |
| *C22C 38/04* | (2006.01) |
| *C22C 38/12* | (2006.01) |
| *C22C 38/16* | (2006.01) |
| *C22C 38/20* | (2006.01) |
| *C22C 38/22* | (2006.01) |
| *C22C 38/24* | (2006.01) |
| *C22C 38/32* | (2006.01) |
| *C22C 38/34* | (2006.01) |
| *C22C 33/02* | (2006.01) |
| *B05D 3/02* | (2006.01) |
| *C23C 26/02* | (2006.01) |

(52) U.S. Cl.
CPC ............... *C22C 38/22* (2013.01); *C22C 38/24* (2013.01); *C22C 38/32* (2013.01); *C22C 38/34* (2013.01); *C22C 33/0257* (2013.01)

(56) References Cited

U.S. PATENT DOCUMENTS

| | | | |
|---|---|---|---|
| RE27,851 E | | 12/1973 | Alessi |
| 4,623,595 A | * | 11/1986 | Futamura et al. ............. 428/553 |
| 5,294,462 A | | 3/1994 | Kaiser et al. |
| 6,649,682 B1 | | 11/2003 | Breton et al. |
| 6,948,784 B2 | | 9/2005 | Wodrich et al. |
| 7,455,811 B2 | | 11/2008 | Sjodin |
| 7,617,805 B2 | | 11/2009 | Highum |
| 2006/0249105 A1 | | 11/2006 | Azevedo |
| 2008/0314353 A1 | | 12/2008 | Highum |
| 2008/0318082 A1 | | 12/2008 | Hartmann et al. |
| 2009/0305078 A1 | | 12/2009 | Sjodin |
| 2011/0014491 A1 | | 1/2011 | Mars et al. |
| 2011/0020166 A1 | | 1/2011 | Otobe et al. |

OTHER PUBLICATIONS

Brazelet F300—For High End Applications, Product Sheet, May 2010, 2 pages.
Brazelet F302—For Cost Efficient Solutions, Product Sheet, Jun. 2010, 2 pages.

* cited by examiner

MACHINE COMPONENT WITH A CAVITATION RESISTANT COATING

TECHNICAL FIELD

The present disclosure relates generally to a cavitation resistant coating, and more particularly, to a machine component with a cavitation resistant coating.

BACKGROUND

Coatings are sometimes used to impart desirable properties to machine components. For instance, a coating may be used to increase the cavitation resistance of a component. Cavitation is material damage caused by the formation and collapse of bubbles, in a liquid. The cavities typically arise from rapid changes in pressure due to vibrations or turbulent flow. During cavitation, the implosion of the bubbles formed in the liquid on the component surface erodes the surface. Cavitation is a source of concern in machine parts that are subject to vibratory forces while in contact with a liquid. Different materials offer different levels of resistance to cavitation. Cast iron is a material known to have relatively low resistance to cavitation. Examples of cast iron machine components that are susceptible to cavitation include, among others, housings of pumps and liners of engine cylinders.

A cylinder liner (referred to herein as a "liner") is a removable cylindrical part fitted into an engine block of an internal combustion engine to form a cylinder. Typically, liners are made of steel or cast iron. An inside surface of the liner bounds the combustion chamber of the cylinder. During operation of the engine, the liners get heated due to the combustion of fuel in the combustion chamber. To cool the liner, a liquid coolant (such as, water) is circulated through a cooling jacket extending about a portion of the outer surface of the liner. Typically, the outer surface of the liner is in direct contact with the coolant circulating through the cooling jacket. It is known that the region of the liner in contact with the coolant experiences erosion from cavitation. Typically, the outer surface of the liner may be treated to increase its resistance to cavitation.

U.S. Pat. No. 7,617,805 (the '805 patent) discloses a method of heat treating the outer surface of the liner to provide a hardened layer of purely martensitic microstructure to inhibit cavitation induced erosion. While the hardened outer layer of the '805 patent may provide some protection from cavitation induced erosion, it may not provide sufficient cavitation protection and/or be suitable for all applications.

The present disclosure is directed to overcoming these or other limitations in existing technology.

SUMMARY

In one aspect, a machine component is disclosed. The component may include a body made of an iron alloy. The body may include a surface and a coating fused to the surface. The coating may be an alloy including phosphorous, carbon, and iron. The coating may have a solidus temperature of less than or equal to about 1000° C., and a hardness greater than or equal to about 50 HRC.

In another aspect, a method of forming a cavitation-resistant coating on a surface of a machine component is disclosed. The method may include preparing the surface of the component for coating, and applying a coating to the surface. The coating may include phosphorous, carbon, and iron. The method may also include heating the surface to at least partially melt the applied coating at a temperature less than or equal to about 1000° C. The method may further include cooling the at least partially melted coating to fuse the coating to the surface. The fused coating may have a hardness greater than or equal to about 50 HRC.

In yet another aspect, a machine component is disclosed. The component may include a body having a surface, and a coating fused to the surface. The coating may be an alloy including between about 4-12% by weight of phosphorous, about 0.5-3.5% by weight of carbon, and iron. The coating may have a solidus temperature less than or equal to about 1000° C.

DETAILED DESCRIPTION

Figure 1:
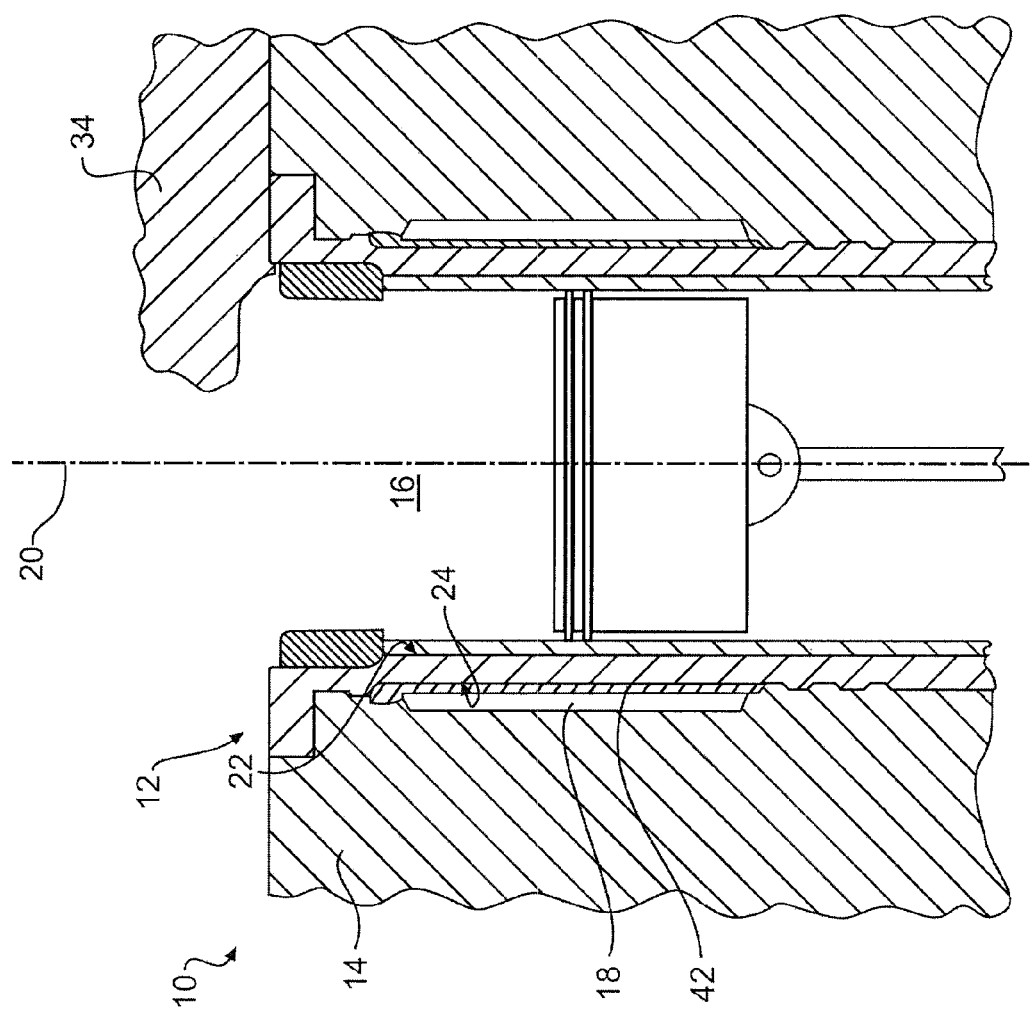
FIG. 1 is a cross-sectional view of part of an engine with a cylinder liner.

FIG. 1 is a cross-sectional view of part of an engine 10 with a cylinder liner 12 ("liner 12"). Engine 10 includes an engine block 14 comprising a piston bore 16. Liner 12 may be removably mounted in the piston bore 16. Liner 12 has a hollow generally cylindrical body extending along a longitudinal axis 20 with an inner surface 22 and an outer surface 24. The liner 12 may be securely retained in piston bore 16 in any manner. A cylinder head 34, secured to the engine block 14, forms a combustion chamber of the engine 10 within the bore 16. The combustion chamber is bounded on the sides by the inner surface 22 of the liner 12. During operation of the engine 10, combustion that occurs in the combustion chamber heats the liner 12. Engine block 14 may include a cooling jacket 18, which circulates a coolant (for example, water) along the outer surface 24, to cool the liner 12. Although FIG. 1 illustrates a single annular cooling jacket 18 around the liner 12, as is known in the art, other configurations are possible. For example, in some embodiments, multiple discrete or connected cooling jackets 18 may extend along portions of the liner 12. The surface of the liner 12 in contact with the coolant in cooling jacket 18 is susceptible to cavitation.

Liner 12 may be made of various iron alloys, including cast iron and steel. During operation of engine 10, vibrations induced in the liner 12 (as a result of normal engine operation) result in the formation of vapor bubbles in the coolant in cooling jacket 18. These bubbles may implode against an outer surface 24 of the liner 12 and cause cavitation damage (or pitting) on the outer surface 24. To protect the outer surface 24 from cavitation damage (or to restore the cavitation damaged outer surface 24), a cavitation resistant coating 42 may be applied to the outer surface 24. Coating 42 may be an iron-based alloy fused to the outer surface 24 of the liner 12. It is known that materials having high hardness generally exhibit better cavitation resistance. It was determined that a hardness of about 50 HRC (Rockwell C) provides sufficient cavitation resistance for typical machine components. Therefore, coating 42 is selected to have a hardness greater than or equal to about 50 HRC. The coating 42 may extend substantially along an entire length of the liner 12, or may only extend along selected portions of the length of the liner 12. In some embodiments, the coating 42 may cover the outer surface 24 of the liner 12 that is exposed to the coolant in coolant jacket 18. In some embodiments, coating 42 may extend circumferentially around liner 12 over substantially all portions of the liner 12 that forms a boundary wall of the coolant jacket 18.

Coating 42 may include an iron-based alloy that may be deposited or otherwise applied to the outer surface 24 of liner 12 and fused (at least partially melted and bonded) to the outer surface 24. The materials that form coating 42 may be applied as a paste, thermal sprayed, or deposited in some other manner (as would be known to a person of ordinary skill in the art) to outer surface 24. After application, the coated outer surface 24 may be heated to above the solidus temperature of the coating 42, to at least partially melt and fuse the coating 42 to the outer surface 24. As would be known to a person or ordinary skill in the art, the solidus temperature of the coating 42 is the temperature at which melting of the coating 42 begins. At the solidus temperature, the coating 42 may not be melted completely (i.e., the solidus is not necessarily a melting point), and the coating 42 will exist as a mixture of solid and liquid phases. In embodiments where the coating 42 is heated to the liquidus temperature or above, the coating 42 will be completely melted. While the coating 42 is above the solidus temperature, the coating 42 (which will be at least partially melted) will enter and fill (partially or fully) crevices and/or surface irregularities (such as, cavitation holes) on outer surface 24 and form a surface layer securely attached to the outer surface 24. The fusing of the coating 42 to the underlying outer surface 24 increases the bond strength of the coating 42 to be more than after typical deposition techniques. In some embodiments, after fusing, the thickness of coating may be between 0.5-4 mm. In some embodiments, the coating thickness may be between about 1-2 mm.

In some embodiments, it is desirable to minimize the maximum temperature that a liner 12 (or another component that the coating 42 is applied on) is exposed to during fusing of the coating 42. For instance, cast iron has a melting temperature of about 1300° C. Therefore, during application of a coating 42 on a cast iron liner 12, it is desirable to maintain the processing temperature of the cast iron liner 12 to well below 1300° C. To ensure that coating 42 is suitable for application on common iron alloys used for machine components, the solidus temperature of coating 42 is selected to be less than or equal to about 1100° C. Solidus temperatures above about 1100° C. may induce heat related damage (softening, warping, etc.) to the liner 12. For increased margin and reliablity, in some embodiments, the solidus temperature of the coating 42 may be selected to be less than or equal to about 1000° C. The coated outer surface 24 may be heated to above the solidus temperature of the coating 42 by any suitable heating process (for example, using a torch, induction heating, laser heating, placing in a furnace) at any ramp rate. In some embodiments, the outer surface 24 (or the entire liner 12) may be soaked at the maximum temperature for a sufficient time to ensure that all regions of the coating 42 are heated. In some embodiments, a brazing-like heating cycle may be used to fuse the coating 42 on the outer surface 24.

After heating the coating 42 to above the solidus temperature to at least partially melt the coating 42, the outer surface 24 (or the liner 12) may be cooled to room or ambient temperature. The coating 42 may be cooled to ambient temperature by any means. In some embodiments, the coating 42 may be cooled to ambient temperature at a fast cooling rate (for example, ≥100° C./sec) using liquid quenching or cooling under a high pressure gas stream (gas quenching). In some embodiments, liquid and gas quenching may be avoided, and the coated component may be cooled to ambient temperature at a cooling rate of less than or equal to about 10° C./sec in still or forced gas such as, for example, air (air cooling). As the coating 42 cools, the coating 42 will transform to martensite (that is, harden). Avoiding a quenching step during cooling may simplify the coating process. Avoiding a quenching step may also improve the durability of the coated liner 12 by eliminating thermal shock associated with quenching. In such embodiments, the chemistry of the coating 42 may be selected so that the coating 42 does not need to be quenched in order for the coating 42 to achieve the desired hardness of greater than about 50 HRC (Rockwell C).

Coating 42 may include phosphorous (P) and carbon (C) in a matrix of iron (Fe). Phosphorous and carbon will decrease the solidus temperature of the coating 42. In general, the iron-carbon-phosphorous ternary phase diagram may be used to determine the percentage ranges of phosphorous and carbon (the balance being iron) in coating 42 that may produce an Fe—P—C alloy having a solidus temperature less than or equal to the desired value (for example, 1000° C.). For instance, an Fe—P—C alloy of about 7% by weight of phosphorous and about 2% by weight of carbon and about 91% by weight of iron (referred to as Fe-7P-2C alloy) has a solidus temperature of about 950° C. Therefore, in some embodiments, the coating 42 may include about 7% by weight of phosphorous, about 2% by weight of carbon, and about 91% by weight of iron. Other concentrations of phosphorous and carbon also result in an alloy having a solidus temperature less than or equal to about 1000° C. As is known in the art, the Fe—P—C ternary phase diagram (or software applications such as, for example, Thermo-Calc) may be used to find Fe—P—C alloys that have a solidus temperature below about 1000° C. (or below some other desired temperature). In general, coating 42 may have between about 4-12% by weight of phosphorous, and about 0.5-3.5% by weight of carbon, and balance iron. In some embodiments, coating 42 may have about 7-9% by weight of phosphorous, and about 1.5-2.5% by weight of carbon, and balance iron.

Addition of copper (Cu) may further reduce the solidus temperature. For example, addition of about 5% of copper to the Fe-7P-2C alloy may decrease the solidus temperature of the alloy to about 930° C. Therefore, in some embodiments, coating 42 may also include copper. If present in coating 42, copper may have a concentration between about 0.1-15% by weight. That is, a coating 42 having about 4-12% by weight of phosphorous and about 0.5-3.5% by weight of carbon may include any amount of copper between about 0.1-15% by weight. In some embodiments of coating 42, the concentration of copper (if present) may be between about 5-10% by weight. Addition of other elements may also decrease the solidus temperature of the coating 42. For example, the addition of about 0.5% of boron (B) to an iron-based coating 42 having about 4-12% by weight of phosphorous and about 0.5-3.5% by weight of carbon (with or without about 0.1-15% by weight of copper) further decreases the solidus temperature by about 10° C. Therefore, in some embodiments, the coating 42 may also include boron.

Coating 42 may also include other elements for other desirable properties. For example, in some embodiments, coating 42 may include one or more of chromium (Cr), manganese (Mn), silicon (Si), nickel (Ni), molybdenum (Mo), vanadium (V), tungsten (W), and cobalt (Co) to improve the air-hardenability of the coating 42. That is, one or more of these elements may be added to coating 42 so that the coating 42 has a martensitic microstructure with a hardness greater than or equal to about 50 HRC upon air cooling (that is, when the fused coating is cooled to ambient temperature without a quenching step). The amount of these hardenability improving elements may depend upon the application. In general, the amount of these elements in coating 42 may be sufficient to provide the desired level of hardness upon air cooling without substantially increasing the cost of the coated component. Table 1 below shows the chemistry of different exemplary embodiments (marked a, b, c, etc.) of coating 42. It should be noted that the concentration of elements in coating 42 are indicated as being approximate (in Table I and in the text) because of expected experimental variations. These experimental variations are expected to less than about 10% of a measured value (that is, an alloy having about (or approximately) 0.1% Cu may have copper from 0.09%-0.11%). It should be noted that, although not individually listed herein, an embodiment of coating 42 in Table I may have any composition within a listed range. For example, a coating of embodiment "a" may include coatings 42 having compositions Fe-7P-2C-5Cu, Fe-6P-3C-4Cu-0.5B, Fe-8P-2.5C-2Ni-1Cr, Fe-5P-3C-1B-4Ni, etc. Further, as discussed previously, a Fe-7P-2C-5Cu coating includes about 7% of phosphorous, about 2% of carbon, about 5% of copper, with the remaining (that is, about 86%) being iron. In general, coating 42 may have any concentration of constituents within a listed range that yields an alloy have a solidus temperature less than or equal to about 1000° C. and a hardness greater than or equal to about 50 HRC.

12 may be a newly fabricated liner 12 or a previously used liner 12 that is being refurbished. To prepare the liner 12 for application of the coating, the outer surface 24 may first be cleaned. The cleaning process may involve degreasing and removal of remnants, if any, of a previous coating from the outer surface 24. Powders of elements in a desired concentration (for example, about 6-8% by weight of phosphorous, about 1-3% by weight of carbon, about 3-7% by weight of copper, with balance being iron) may be mixed with a commercial binder (glue, etc.) to form a paste or a slurry (step 110). The slurry may be applied to the outer surface 24 (step 120) of the liner 12. Any process (such as, for example, painting) may be used to apply the slurry to the outer surface 24. The applied slurry may then be dried in air or in a low temperature furnace. The outer surface 24, with the applied slurry, may then be heated to above the solidus temperature (for example, of less than or equal to about 1000° C.) to at least partially melt the slurry (step 130). Any heating process may be used to heat the outer surface 24. In some embodiments, the liner 12 with the applied slurry may be placed in a

| Elements | Approximate percentage concentration (%) by weight | | | | | | |
|---|---|---|---|---|---|---|---|
|  | (a) | (b) | (c) | (f) | (g) | (h) | (i) |
| P | 4-12 | 4-12 | 5-10 | 6-8 | 6-8 | 6-8 | 7-9 |
| C | 0.5-3.5 | 0.5-3.5 | 1.5-3 | 1.0-2.5 | 1.0-2.5 | 1.0-2.5 | 1.5-2.5 |
| Cu | 0.1-15 | 0.5-15 | 2-10 | — | 3-7 | — | 5-10 |
| B | 0-1 | 0.2-1 | 0.25-1 | — | — | 0.25-1 | — |
| Si | 0-3 | 0.2-3 | 0.5-3 | — | — | — | — |
| Mn | 0-1.5 | 0.2-1.5 | 0.5-1.5 | — | — | — | 1-2.5 |
| Ni | 0-5 | 0-5 | 0-2 | — | — | — | — |
| Cr | 0-15 | 0.1-15 | 5-10 | 5-13 | 5-13 | 5-13 | 5-13 |
| Mo | 0-11 | 0.2-11 | 0.5-3 | — | — | — | — |
| V | 0-6 | 0.2-6 | 0.1-2 | — | — | — | — |
| Fe | Balance | Balance | Balance | Balance | Balance | Balance | Balance |

In some applications of coating 42, the concentration of a constituent above the maximum value listed in Table I may increase the cost and/or impart undesirable properties to the coated component. For example, in some applications, amounts of Mn and Ni above that listed in Table I may increase the cost of the coated component and decrease the hardness of the resulting coating 42.

It should be noted that, although the coating 42 is describes as being used to increase the cavitation resistance of a component, this is not a limitation. In some embodiments, coating 42 may be applied to impart other desirable properties to a component. For instance, it is contemplated that in some embodiments, a coating 42 may be applied to increase the wear resistance of a crank shaft.

Industrial Applicability

The disclosed machine component may be applied in any application where it is desired to increase the resistance of the component to cavitation-induced damage. A cavitation resistant coating may be fused to a surface of the machine component that operates in communication with a liquid, and may therefore be subjected to cavitation-induced erosion. The fused cavitation resistant coating has a solidus temperature less than or equal to about 1100° C. (or about 1000° C.) and a hardness greater than or equal to about 50 HRC. In general, the coating may include phosphorous and carbon in a matrix of iron with limited amounts of other elements. An exemplary method of forming a cavitation resistant coating 42 on the outer surface 24 of a cylinder liner 12 is described below.

Figure 2:
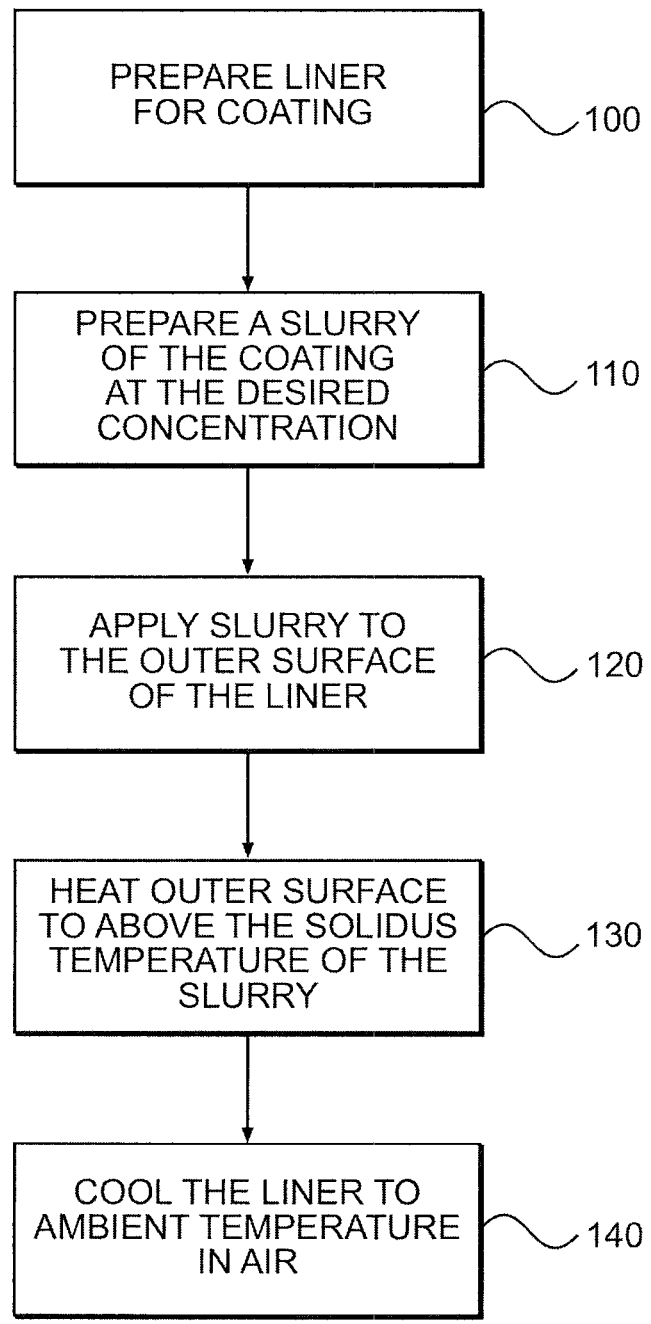
FIG. 2 is a flow chart illustrating an exemplary method of making a cavitation resistant coating of the cylinder liner of FIG. 1.

FIG. 2 discloses an exemplary method of applying the coating 42 on the liner 12. The outer surface 24 of the liner 12 may be prepared for applying the coating 42 (step 100). Liner furnace maintained at a temperature slightly above the solidus temperature for about 10 minutes to evenly heat the slurry. In general, the soak time (the time for which the component is maintained at the temperature above the solidus temperature of the slurry) may depend on the application (size of the component, number of components in the furnace, etc.). The liner 12 may then be cooled to ambient temperature in air (step 140). Cooling the liner 12 may include cooling the coating 42 under a cooling rate of less than or equal to about 10° C./sec in still gas or a forced gas stream. In embodiments where the liner 12 is heated in a furnace, air cooling may include shutting the furnace off and allowing the coated liner 12 to cool slowly in the furnace. Air cooling may also include removing the coated liner 12 from the furnace and allowing the liner 12 to cool to ambient temperature outside the furnace. In general, cooling the liner 12 may include any method of cooling, the liner 12 to ambient temperature without quenching the liner 12. During cooling, the at least partially melted slurry may fuse with the outer surface 24 to form a coating 42 having a hardness greater than or equal to about 50 HRC.

Although aspects of the current disclosure are described using a cylinder liner, in general, a coating 42 of the current disclosure may be applied to any iron alloy component. It will be apparent to those skilled in the art that various modifications and variations can be made to the disclosed machine component. Other embodiments will be apparent to those skilled in the art from consideration of the specification and practice of the disclosed machine component. It is intended that the specification and examples be considered as exemplary only, with a true scope being indicated by the following claims and their equivalents.

What is claimed is:

1. A cylinder liner, comprising:
a body made of an iron alloy, the body including an outer surface that is configured to operate in communication with a liquid coolant; and
a coating fused to the surface of the body, the coating being an alloy including phosphorous, carbon, and iron, the coating having a solidus temperature of less than or equal to about 1000° C., and a hardness greater than or equal to about 50 HRC 2. The cylinder liner of claim 1, wherein the coating has a thickness between about 0.5 mm to about 4 mm.

3. The cylinder liner of claim 1, wherein the coating includes about 4% to about 12% by weight of phosphorous and about 0.5% to about 3.5% by weight of carbon.

4. The cylinder liner of claim 3, wherein the coating further includes copper between about 0.1% to about 15% by weight.

5. The cylinder liner of claim 3, wherein the coating further includes boron less than or equal to about 1% by weight.

6. The cylinder liner of claim 3, wherein the coating includes at least one of silicon less than or equal to about 3% by weight, manganese between about 0.1% to about 5% by weight, nickel less than or equal to about 5% by weight, chromium between about 0.1% to about 15% by weight, molybdenum less than or equal to about 11% by weight, and vanadium less than or equal to 6% by weight.

7. The cylinder liner of claim 1, wherein the coating includes about 7% to about 9% by weight of phosphorous, and about 1.5% to about 2.5% by weight of carbon.

8. The cylinder liner of claim 7, wherein the coating further includes about 5% to about 10% by weight of copper.

9. The cylinder liner of claim 7, wherein the coating further includes at least one of about 1% to about 2.5% by weight of manganese, and about 5% to about 13% by weight of chromium.

10. A cylinder liner, comprising:
a body having an outer surface that is configured to operate in communication with a liquid coolant; and
a coating fused to the surface of the body, the coating being an alloy including about 4% to about 12% by weight of phosphorous, about 0.5% to about 3.5% by weight of carbon, and iron, the coating having a solidus temperature less than or equal to about 1000° C.

11. The cylinder liner of claim 10, wherein the coating has a hardness greater than or equal to about 50 HRC.

12. The cylinder liner of claim 11, wherein the coating further includes at least one of boron less than or equal to 1% by weight, silicon less than or equal to about 3% by weight, manganese between about 0.1% to about 5% by weight, nickel less than or equal to about 5% by weight, chromium between about 0.1% to about 15% by weight, molybdenum less than or equal to about 11% by weight, and vanadium less than or equal to 6% by weight.

13. The cylinder liner of claim 11, wherein the coating includes about 7% to about 9% by weight of phosphorous, and about 1.5% to about 2.5% by weight of carbon.

* * * * *